(12) United States Patent
Vesce, III et al.

(10) Patent No.: US 11,277,909 B2
(45) Date of Patent: Mar. 15, 2022

(54) THREE-DIMENSIONAL CIRCUIT ASSEMBLY WITH COMPOSITE BONDED ENCAPSULATION

(71) Applicant: TTM TECHNOLOGIES, INC., Santa Ana, CA (US)

(72) Inventors: John Vesce, III, Somers, CT (US); Joseph William Heery, Jr., Tolland, CT (US)

(73) Assignee: TTM TECHNOLOGIES INC., Santa Ana, CA (US)

( * ) Notice: Subject to any disclaimer, the term of this patent is extended or adjusted under 35 U.S.C. 154(b) by 0 days.

(21) Appl. No.: 17/006,316

(22) Filed: Aug. 28, 2020

(65) Prior Publication Data
US 2021/0068250 A1    Mar. 4, 2021

Related U.S. Application Data

(60) Provisional application No. 62/894,410, filed on Aug. 30, 2019.

(51) Int. Cl.
| | | |
|---|---|---|
| *H05K 1/00* | (2006.01) | |
| *H05K 1/02* | (2006.01) | |
| *H05K 1/03* | (2006.01) | |
| *H05K 1/05* | (2006.01) | |
| *H05K 1/11* | (2006.01) | |
| *H05K 1/16* | (2006.01) | |
| *H05K 1/18* | (2006.01) | |
| *H05K 3/00* | (2006.01) | |
| *H05K 3/30* | (2006.01) | |
| *H01L 21/56* | (2006.01) | |
| *H01L 21/66* | (2006.01) | |
| *H01L 23/12* | (2006.01) | |
| *H01L 23/14* | (2006.01) | |
| *H01L 23/34* | (2006.01) | |

(Continued)

(52) U.S. Cl.
CPC ........... *H05K 1/036* (2013.01); *H05K 1/0284* (2013.01); *H05K 3/0014* (2013.01); *H05K 3/467* (2013.01); *H05K 2201/0275* (2013.01); *H05K 2201/05* (2013.01)

(58) Field of Classification Search
CPC .. H05K 1/00; H05K 1/02; H05K 1/03; H05K 1/05; H05K 1/11; H05K 1/16; H05K 1/18; H05K 3/00; H05K 3/30
USPC ................ 174/254, 250, 255–260; 361/771; 156/306.6; 428/209, 461, 475.8, 901; 438/7, 127

See application file for complete search history.

(56) References Cited

U.S. PATENT DOCUMENTS 4,671,984 A * 6/1987 Maeda .................... C08L 23/08
428/209
4,751,146 A * 6/1988 Maeda ................. H05K 1/0326
428/209

(Continued)

*Primary Examiner* — Xiaoliang Chen
(74) *Attorney, Agent, or Firm* — Polsinelli PC

(57) ABSTRACT

The disclosure provides a three-dimensional circuit assembly including a printed circuit board comprising a top film surface and a bottom film surface opposite to the top film surface. The three-dimensional circuit assembly may also include a first layer of a composite material bonded or laminated on the top film surface. The three-dimensional circuit assembly may further include a second layer of the composite material bonded or laminated on the bottom film surface of the printed circuit board.

11 Claims, 5 Drawing Sheets

(51) Int. Cl.
   *H01L 23/48*     (2006.01)
   *H01L 23/52*     (2006.01)
   *H01L 23/498*    (2006.01)
   *H05K 3/46*      (2006.01)

(56) References Cited

U.S. PATENT DOCUMENTS

| | | | | |
|---|---|---|---|---|
| 5,103,293 A * | 4/1992 | Bonafino | ............... | H01L 23/145 |
| | | | | 174/256 |
| 5,519,176 A * | 5/1996 | Goodman | ......... | H01L 23/49822 |
| | | | | 174/250 |
| 2009/0056995 A1* | 3/2009 | Maeda | ................... | B32B 15/08 |
| | | | | 174/259 |
| 2011/0030212 A1* | 2/2011 | Hamatani | ............... | H01L 24/05 |
| | | | | 29/874 |
| 2011/0032684 A1* | 2/2011 | Hamatani | ............... | H01L 24/13 |
| | | | | 361/762 |
| 2011/0244636 A1* | 10/2011 | Kondo | .............. | H01L 23/49822 |
| | | | | 438/127 |
| 2011/0266666 A1* | 11/2011 | Maeda | .................... | H01L 24/19 |
| | | | | 257/698 |
| 2011/0297431 A1* | 12/2011 | Yamada | ............... | H05K 3/4015 |
| | | | | 174/258 |
| 2012/0006481 A1* | 1/2012 | Azami | ................. | B32B 15/043 |
| | | | | 156/306.6 |
| 2012/0231557 A1* | 9/2012 | Inoue | ................. | H01L 21/6836 |
| | | | | 438/7 |
| 2012/0285617 A1* | 11/2012 | Azami | ..................... | C08J 5/042 |
| | | | | 156/306.6 |
| 2012/0305182 A1* | 12/2012 | Azami | .................... | B32B 15/20 |
| | | | | 156/306.6 |
| 2013/0087375 A1* | 4/2013 | Tsunoi | ................. | H05K 1/0278 |
| | | | | 174/260 |
| 2014/0078706 A1* | 3/2014 | Hu | ...................... | H01L 21/4853 |
| | | | | 361/771 |

* cited by examiner

SECTION A-A

THREE-DIMENSIONAL CIRCUIT ASSEMBLY WITH COMPOSITE BONDED ENCAPSULATION

CROSS-REFERENCE TO RELATED APPLICATION

The disclosure claims the benefit under 35 U.S.C. § 119(e) of U.S. Provisional Patent Application No. 62/894,410, entitled "Three-dimensional Circuit Assembly with Composite Bonded Encapsulation," filed on Aug. 30, 2019, which is incorporated herein by reference in its entirety.

BACKGROUND

Current flexible printed circuits are severely limited in the manner they are used due to the nature of the materials used for manufacturing and the materials' associated environmental limitations. These limitations include, but are not limited to, exposure to excessive heat, ultraviolet light, and physical abrasion, chemical corrosion, among others.

Traditional flexible circuit boards utilize a polyimide film to cover the circuitry contained in the flexible regions of the printed circuit board; however, typical polyimide films will not adhere to resin pre-impregnated fabrics or fibers, such as carbon fibers or glass fibers.

SUMMARY

This disclosure provides a flexible or rigid type printed circuit board. The disclosure also provides systems and methods for fabricating an electrical interconnect comprising the flexible or rigid type printed circuit board encapsulated with an external composite material such as a carbon fiber material bonded to the flexible or rigid circuit. In one embodiment, the carbon fiber material may include a pre-impregnated, partially cured thermoset resin material. The resultant article is a planar or three-dimensional shaped circuit assembly. Additionally, flexible or semi-flexible circuits encapsulated within a carbon fiber or similar composite structures can be used to create intelligent structures.

In one embodiment, a three-dimensional circuit assembly may include a printed circuit board comprising a top film surface and a bottom film surface opposite to the top film surface. The three-dimensional circuit assembly may also include a first layer of a composite material bonded or laminated on the top film surface. The three-dimensional circuit assembly may further include a second layer of the composite material bonded or laminated on the bottom film surface of the printed circuit board.

In some embodiments, the composite material may include carbon fibers embedded in a resin.

In some embodiments, the resin is a thermoset resin.

In some embodiments, the composite material may include glass fibers embedded in a resin.

In some embodiments, the three-dimensional circuit assembly is in a curved planar shape.

In some embodiments, the three-dimensional circuit assembly may include a first composite fabrics disposed over a top of the first layer of the composite material.

In some embodiments, the three-dimensional circuit assembly may include a second composite fabrics placed under a bottom of the second layer of the composite material.

In some embodiments, the three-dimensional circuit assembly is rigid.

In some embodiments, the three-dimensional circuit assembly is flexible or semi-flexible.

In some embodiments, the top film surface and the bottom film surface of the printed circuit comprises polyimide.

In another embodiment, a method is provided for fabricating a three-dimensional circuit assembly. The method may include assembling a printed circuit board between a first pre-formed layer of fibers with a first pre-impregnated resin and a second pre-formed layer of fibers with a second pre-impregnated resin to form a stack. The method may also include placing the stack on a mold shaped to form a three-dimensional circuit assembly. The method may further include applying a vacuum system to the stack and the three-dimensional mold to form the three-dimensional circuit assembly. The three-dimensional circuit assembly includes a first layer of a composite material bonded or laminated on the top film surface, and a second layer of the composite material bonded or laminated on the bottom film surface of the printed circuit board In some embodiments, the vacuum system is a temperature controlled vacuum system.

In some embodiments, the vacuum system comprises an autoclave pressure chamber.

In some embodiments, the step of applying a vacuum system to the stack and the three-dimensional mold to form the three-dimensional circuit assembly may include curing the pre-impregnated resin.

In some embodiments, the first pre-impregnated resin and the second pre-impregnated resin are a thermoset resin.

In some embodiments, at least one of the first pre-impregnated resin and the second pre-impregnated resin is fully cured, wherein the circuit is rigid.

In some embodiments, at least one of the first pre-impregnated resin and the second pre-impregnated resin is fully cured, wherein the circuit is flexible or semi-flexible.

In some embodiments, the method may also include pre-treating a top film surface and a bottom film surface of the printed circuit board with a plasma gas.

In some embodiments, each of the top film surface and the bottom film surface comprises polyimide.

In some embodiments, the plasma gas comprises at least one of $CF_4$, $N_2$, or $O_2$.

Additional embodiments and features are set forth in part in the description that follows, and will become apparent to those skilled in the art upon examination of the specification or may be learned by the practice of the disclosed subject matter. A further understanding of the nature and advantages of the disclosure may be realized by reference to the remaining portions of the specification and the drawings, which form a part of this disclosure.

BRIEF DESCRIPTION OF THE DRAWINGS

The accompanying drawings illustrate embodiments and/or aspects of the disclosure and, together with the written description, serve to explain the principles of the disclosure. Wherever possible, the same reference numbers are used throughout the drawings to refer to the same or like elements of an embodiment, and wherein.

DETAILED DESCRIPTION

Figure 1:
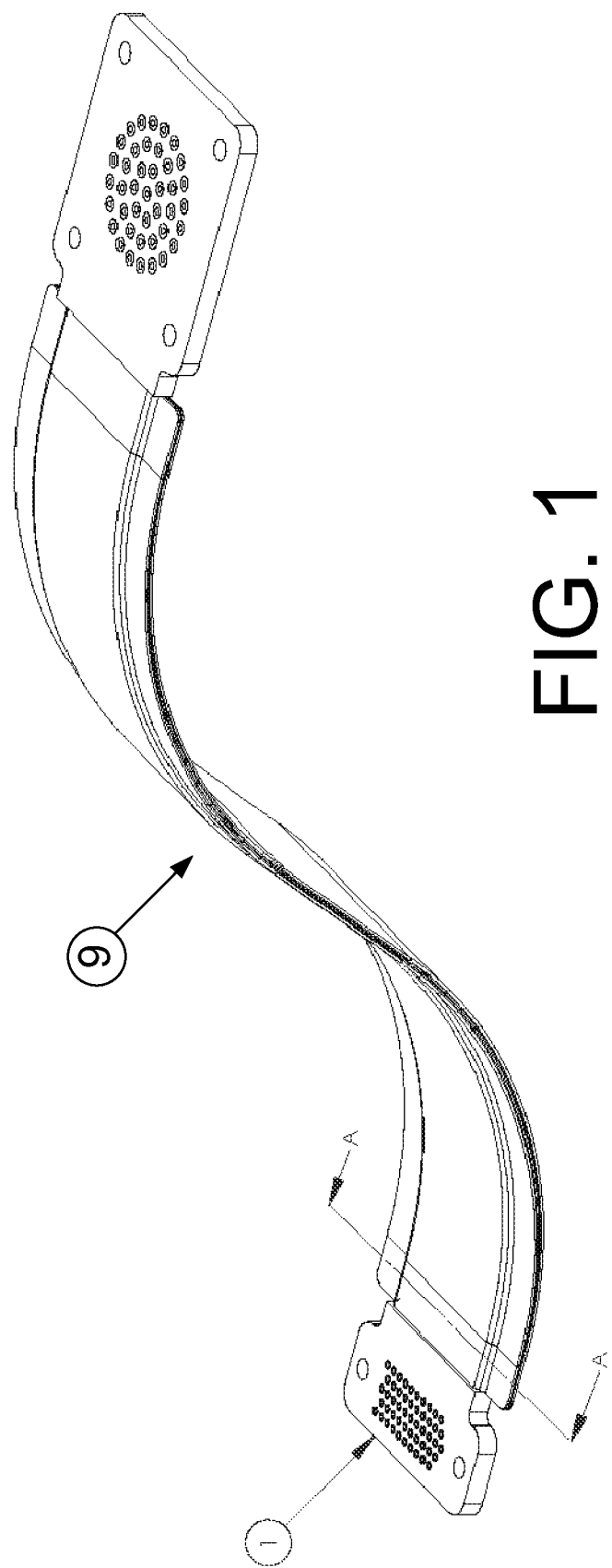
FIG. 1 is an example illustration of the disclosure containing a flexible or semi-flexible circuit formed and encapsulated by a composite material including fibers (e.g. carbon fiber) bonded to the flexible or semi-flexible circuit according to an example embodiment.

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. In addition, it is to be understood that the phraseology and terminology used herein is for the purpose of description and should not be regarded as limiting. The use of "including" "comprising or "having and variations thereof herein is meant to encompass the items listed thereafter and equivalents thereof as well as additional items. Unless specified or limited otherwise, the terms "mounted," "connected," "supported, and "coupled and variations thereof are used broadly and encompass both direct and indirect mountings, connections, Supports, and couplings. Further, "connected" and "coupled are not restricted to physical or mechanical connections or couplings.

Various modifications to the illustrated embodiments will be readily apparent to those skilled in the art, and the generic principles herein can be applied to other embodiments and applications without departing from embodiments of the disclosure. Thus, embodiments of the disclosure are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the disclosure. Skilled artisans will recognize the examples provided herein have many useful alternatives that fall within the scope of embodiments of the disclosure.

As described in this disclosure, encapsulation of a flexible or semi-flexible circuit, by bonding, laminating, or similar physical surface attachment process within a carbon fiber reinforced composite or a similar composite (e.g. glass fiber reinforced) can overcome the environmental limitations applicable to a traditionally manufactured flexible or semi-flexible printed circuit. Moreover, embedding a flexible or semi-flexible electrical interconnect within a preferably thin-profile structure, permits the fabrication of connective structures not possible using conventionally insulated round wires. As an additional advantage, the systems and methods disclosed herein for encapsulating a flexible or semi-flexible circuit within a carbon fiber or similar composite structure can create an intelligent structure using sensing electronic components typically found on traditional rigid printed circuit boards.

This disclosure provides a flexible or rigid type printed circuit board. The disclosure also provides systems and methods for disclosure fabricating an electrical interconnect comprising a flexible or semi-flexible or rigid printed circuit board encapsulated with an external composite material bonded to the flexible or semi-flexible (or rigid) circuit. The resultant assembly is a rigid, flexible, or semi-flexible circuit in a three-dimensional form providing enhanced environmental and reliability capabilities. In one embodiment, the carbon fiber material may include a pre-impregnated, partially cured thermoset resin material. The resultant article is a planar or three-dimensional shaped circuit assembly.

The described in reference to a fiber reinforced composite, such as carbon fiber, the encapsulating material may be any suitable material having desirable properties such as but not limited to a high tensile strength, desirable stiffness, high temperature tolerances, low thermal expansion properties, lightweight, and high chemical resistance.

Figure 2:
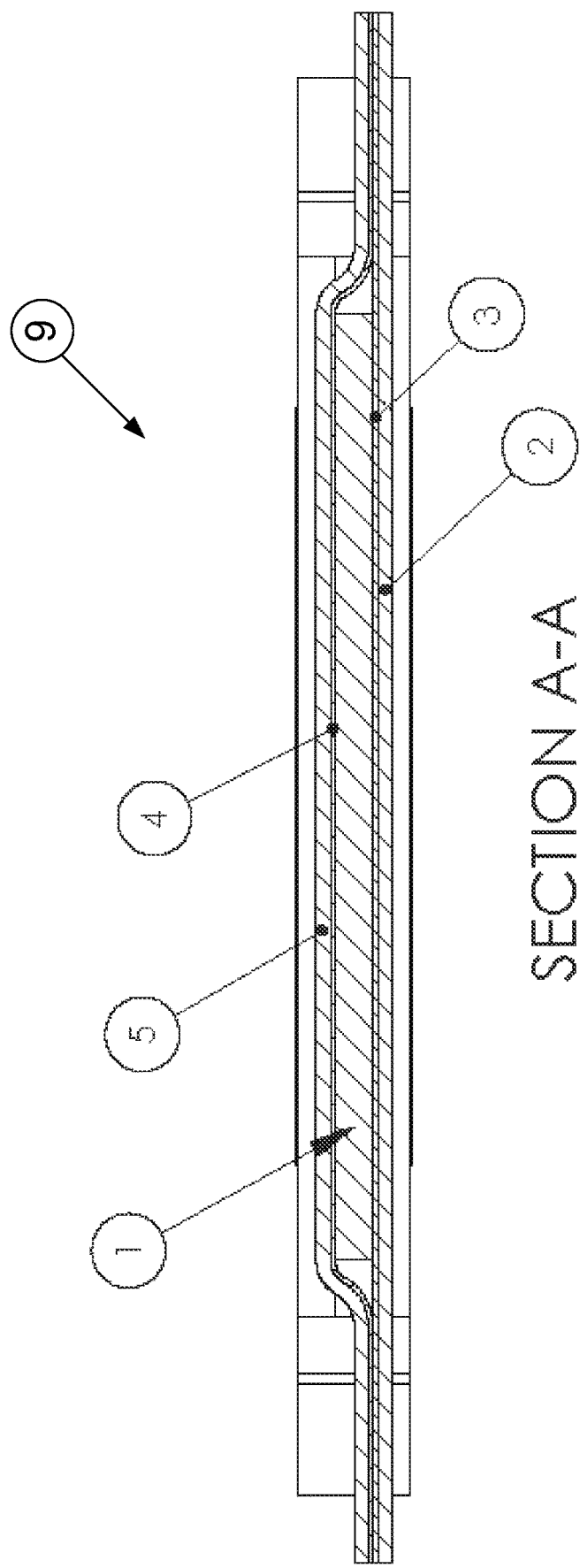
FIG. 2 is a sectional view of FIG. 1 illustrating the final bonded state of the disclosure with respect to the materials utilized according to an example embodiment.
Figure 3:
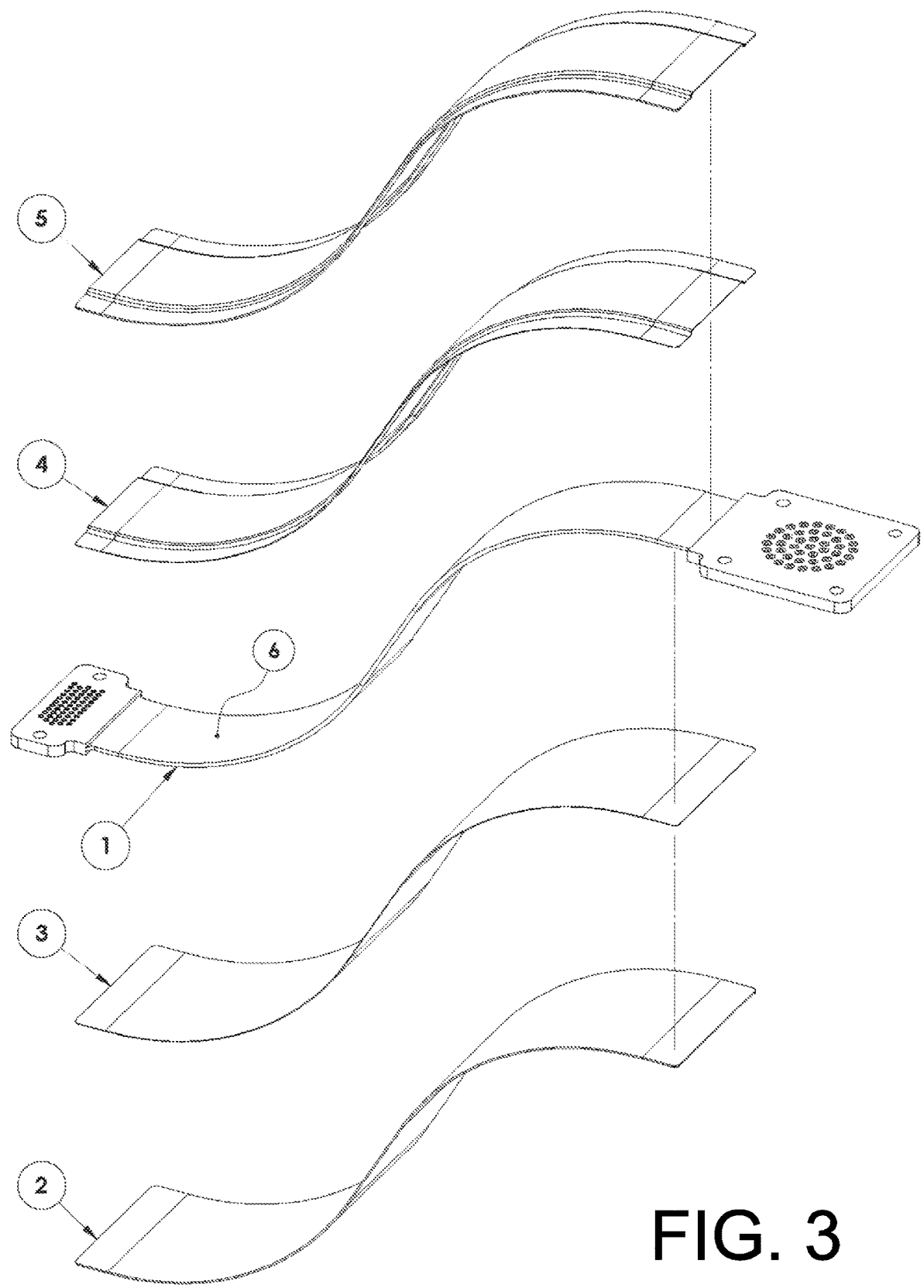
FIG. 3 illustrates an exploded view of the materials and surface preparation utilized for the disclosure according to an example embodiment.

Referring now to FIGS. 1-3, an embodiment of a three-dimensional (3-D) printed circuit assembly 9 composed of a flexible or semi-flexible printed circuit and pre-impregnated resin layers bonded within a carbon-fiber sheath is shown. The 3-D printed circuit assembly 9 is illustrated as a curved planar stack. The circuit 1 is encapsulated by one or more resin pre-impregnated composite layers 3, 4 that contact a top surface and a bottom surface of the circuit 1. The circuit 1 and layers 3, 4 may be further encapsulated or sheathed in an external composite layers 2, 5. In some embodiments, the external composite layers 2, 5 may be composite fabrics, such as carbon fibers or glass fibers or woven fabrics. While shown as individual pieces, in various embodiments the composite layers 3, 4 and 2, 5 may be pre-formed sleeves that encircle the circuit 1 or a circuit and composite layer assembly.

Figure 4:
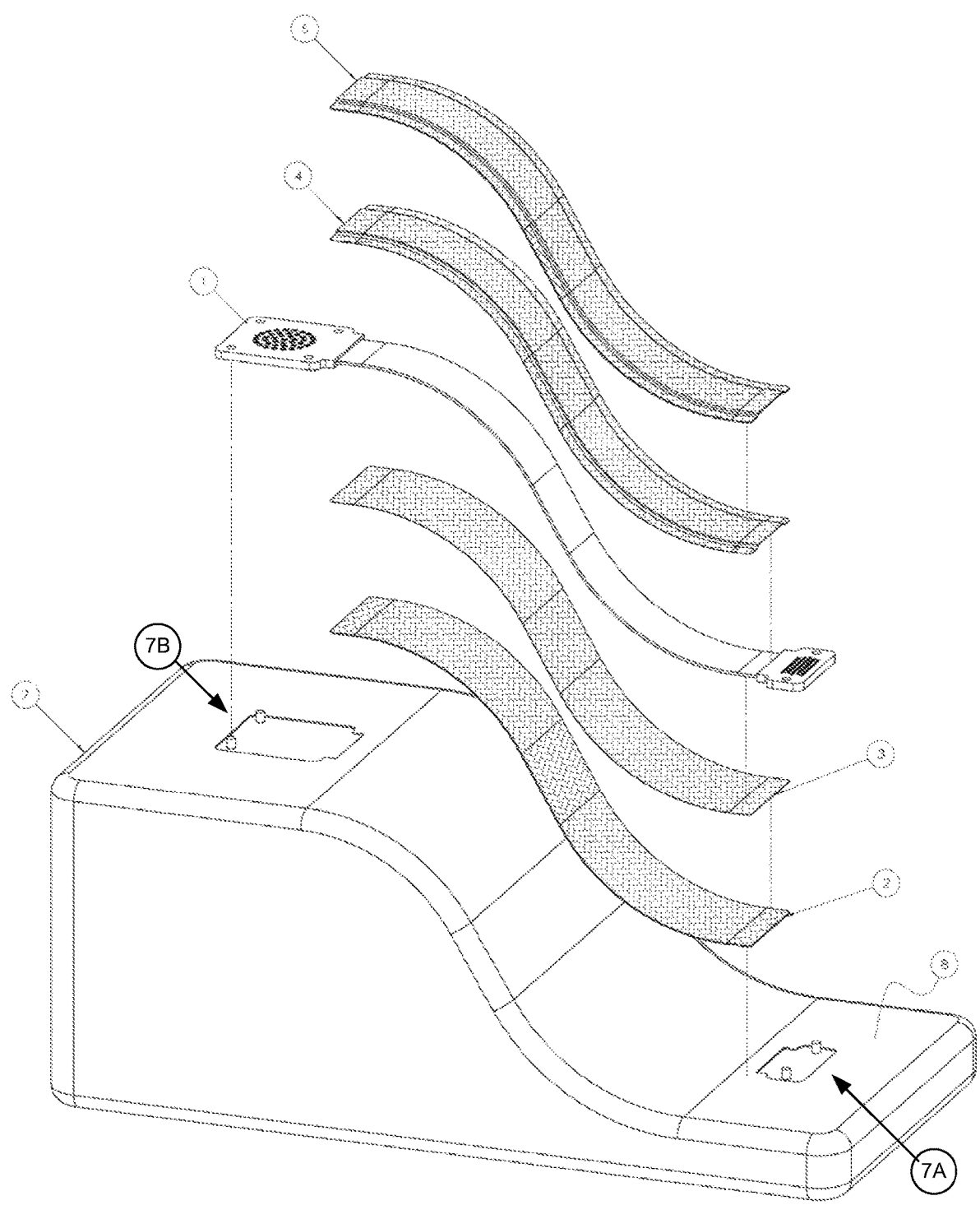
FIG. 4 illustrates a layup sequence of all materials and surface preparation utilizing a mold to form a circuit assembly in a desired three-dimensional shape according to an example embodiment.
Figure 5:
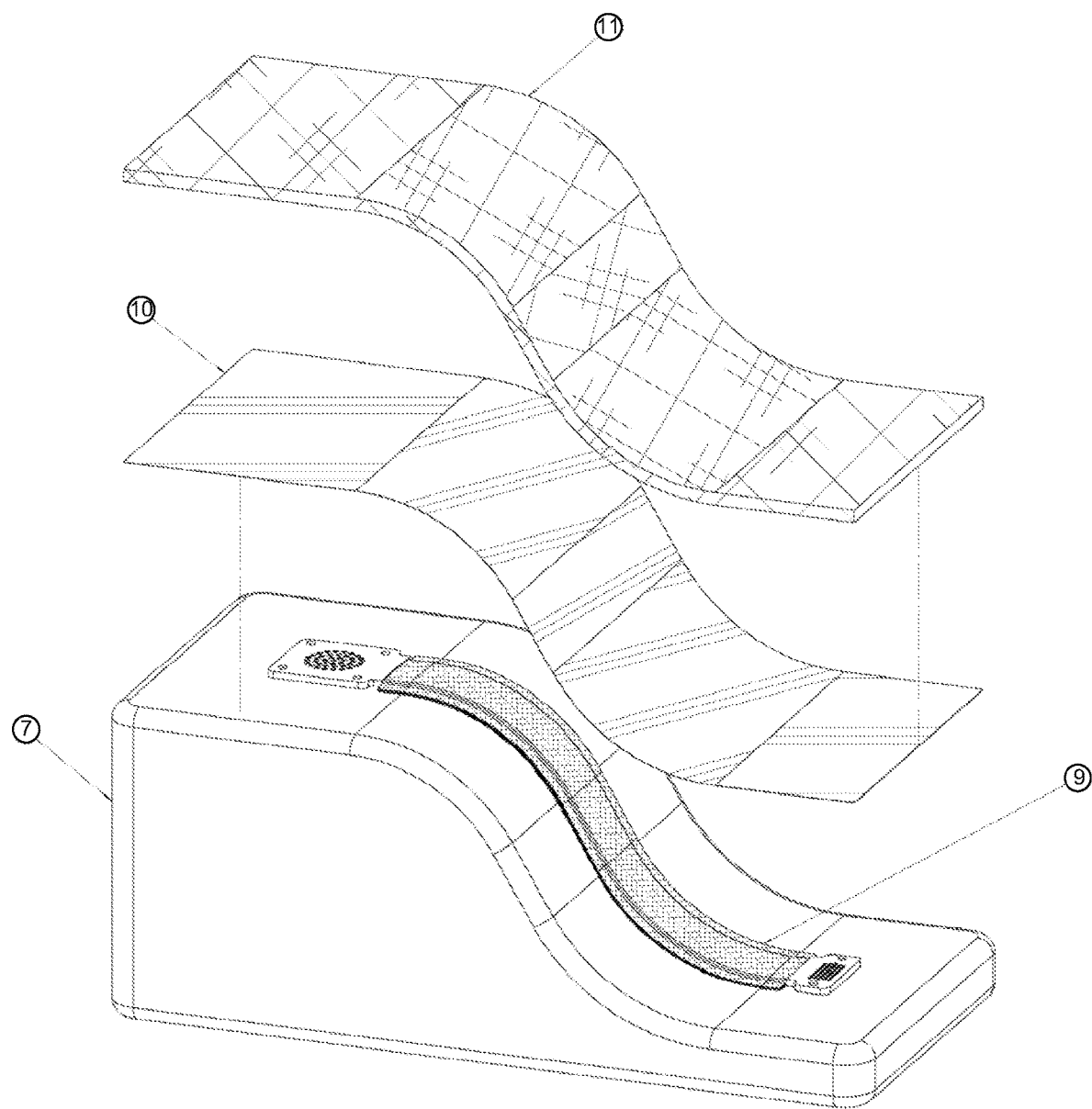
FIG. 5 illustrates additional support materials as used for the molding process according to an example embodiment.

Referring now to FIGS. 4 and 5, a mold 7 is illustrated for manufacturing one embodiment of the 3-D circuit assembly 9. The mold 7 is composed of a suitable material to support the circuit 1 and the composite layers 2, 3, 4, 5 throughout the manufacturing process. As shown, the mold 7 is provided with the curved shape and/or contour for the final desired 3-D assembly 9. In various embodiments, the mold can include retention pins 7A and 7B to help retain the circuit 1 through the entire layup and lamination process. The retention pins 7A and 7B are placed at opposite ends of the circuit 1 and are at different heights from a base surface of the mold 7.

Prior to forming the 3-D circuit assembly 9, the mold 7, circuit 1, and composite layers 3 and 4 can be pre-treated. For example, the surfaces 8 of the mold 7, as shown in FIG. 4, are treated with a release compound to facilitate or allow the easy removal of the finished 3-D structure 9 from the mold. In another example, the composite layers 3 and 4 may be impregnated with one or more partially cured thermoset resin material. Furthermore, the polyimide film surfaces 6 of the flexible printed circuit 1 undergo a surface treatment by exposure to a plasma gas or other suitable methods that modify the polyimide film surface 6 to enable proper adhesion with the pre-impregnated materials of composite layers 3, 4.

In particular, the polyimide film surfaces 6 of the flexible printed circuit 1, as shown in FIG. 3, may be exposed to one or more various plasmas in a cyclical manner. According to one embodiment, the polyimide film is exposed to plasmas of $CF_4$, $N_2$, and $O_2$ gasses. In one embodiment, a two-pass plasma cycle at a pre-determined duration and temperature provided superior adhesion. In another embodiment, the plasma cycle may be optimized for the particular components of each circuit 1 or the particular shape and use of the final flexible circuit assembly 9. It will be appreciated by those skilled in the art that other surface preparation processes, including 1) mechanical surface preparation, 2)

chemical surface preparation, 3) coating with an adhesion promotor, or 4) plasma or combinations thereof, can be used.

According to one embodiment, the first composite fabric 2, including carbon fibers or glass fibers, is placed on the mold 7, followed by a first resin pre-impregnated composite 3. The flexible printed circuit 1 is the placed on the resin pre-impregnated fiber 3. In some embodiments, the fiber may be carbon fibers. In some embodiments, the fiber may be glass fibers.

As shown in FIG. 4, the retention pins 7A and 7B can be used to position and retain the circuit 1 on the mold 7. Another layer of resin pre-impregnated fiber material 4 (prior to curing) is placed over the circuit 1, ensuring that it conforms around the edges of the circuit 1, followed by the addition of another composite fabric 5.

After assembly of layers 1-5, the mold 7 and the assembled layers are covered by a film release sheet 10 and a breather material 11 followed by placement into a temperature controlled vacuum system or a similar autoclave pressure chamber, as shown in FIG. 5. A vacuum is then applied to the covered assembly. The decreased pressure in the vacuum system fully compresses the assembled layers while also curing the resin pre-impregnated fiber materials 3, 4.

After curing and compressing the assembled layers, the formed 3-D circuit assembly 9 can be removed from the vacuum bag (not shown) and support materials including the mold 7, the film release sheet 10, and the breather material 11. The 3-D circuit assembly 9 is then trimmed of any process flashing, machined as desired (such as holes or notches) and deburred.

According to one aspect, curing the layers of resin pre-impregnated fiber materials forms composite layers 3, 4 and results in a rigid 3-D circuit. In the composite layers 3, 4, the resin may be fully cured, where the circuit can be a rigid 3-D circuit. In another aspect, the 3-D circuit assembly retains flexibility and can be further manipulated after the curing of the pre-impregnated layers. In the composite layers 3, 4, the resin may be fully cured, where the circuit can be a flexible or semi-flexible 3-D circuit. In some variations, different resins and/or glass styles of composite fabrics may result in a 3-D circuit that is rigid, semi-rigid, or semi-flexible, when the resin is fully cured. In some variations, whether the circuit is rigid, flexible, or semi-flexible may vary with the fabric style.

In some variations, a three-dimensional circuit assembly comprising any feature described, either individually or in combination with any other features, in any configuration, as disclosed herein.

In some variations, a method for making a three-dimensional circuit assembly comprising any feature described, either individually or in combination with any other features, in any configuration, as disclosed herein.

The description above includes example systems, methods, techniques, instruction sequences, and/or computer program products that embody techniques of the present disclosure. However, it is understood that the described disclosure may be practiced without these specific details.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A three-dimensional circuit assembly comprising:
    a printed circuit board comprising a circuit between a top film and a bottom film opposite to the top film;
    a first layer of a composite material bonded or laminated on the top film; and
    a second layer of the composite material bonded or laminated on the bottom film of the printed circuit board, wherein the printed circuit board is encapsulated by the first layer and the second layer of the composite material.

2. The three-dimensional circuit assembly of claim 1, wherein the first layer and the second layer of the composite material comprise carbon fibers embedded in a resin.

3. The three-dimensional circuit assembly of claim 2, wherein the resin is a thermoset resin.

4. The three-dimensional circuit assembly of claim 1, wherein the first layer and the second layer of the composite material comprise glass fibers embedded in a resin.

5. The three-dimensional circuit assembly of claim 1, wherein the three-dimensional circuit assembly is in a curved planar shape.

6. The three-dimensional circuit assembly of claim 1, further comprising a first fabric disposed over a top of the first layer of the composite material.

7. The three-dimensional circuit assembly of claim 1, further comprising a second fabric placed under a bottom of the second layer of the composite material.

8. The three-dimensional circuit assembly of claim 1, wherein the three-dimensional circuit assembly is rigid.

9. The three-dimensional circuit assembly of claim 1, wherein the three-dimensional circuit assembly is flexible or semi-flexible.

10. The three-dimensional circuit assembly of claim 1, wherein the top film and the bottom film of the printed circuit board comprise polyimide.

11. The three-dimensional circuit assembly of claim 1, wherein the top film and the bottom film of the printed circuit board comprise a polymer material.

* * * * *